United States Patent
D'Evelyn et al.

(10) Patent No.: US 10,293,318 B2
(45) Date of Patent: May 21, 2019

(54) PRESSURE RELEASE MECHANISM FOR CAPSULE AND METHOD OF USE WITH SUPERCRITICAL FLUIDS

(71) Applicant: SLT TECHNOLOGIES, INC., Los Angeles, CA (US)

(72) Inventors: Mark Philip D'Evelyn, Santa Barbara, CA (US); Rajeev Tirumala Pakalapati, Santa Barbara, CA (US)

(73) Assignee: SLT TECHNOLOGIES, INC., Los Angeles, CA (US)

( * ) Notice: Subject to any disclaimer, the term of this patent is extended or adjusted under 35 U.S.C. 154(b) by 295 days.

(21) Appl. No.: 15/269,538

(22) Filed: Sep. 19, 2016

(65) Prior Publication Data

US 2017/0081779 A1    Mar. 23, 2017

Related U.S. Application Data

(60) Provisional application No. 62/220,096, filed on Sep. 17, 2015.

(51) Int. Cl.
| | | |
|---|---|---|
| B01J 13/00 | (2006.01) | |
| B01J 3/00 | (2006.01) | |
| B01J 3/04 | (2006.01) | |
| C30B 7/10 | (2006.01) | |
| C30B 35/00 | (2006.01) | |
| B08B 7/00 | (2006.01) | |

(52) U.S. Cl.
CPC ............... *B01J 3/008* (2013.01); *B01J 3/042* (2013.01); *C30B 7/10* (2013.01); *C30B 35/002* (2013.01); *B08B 7/0021* (2013.01); *Y02P 20/544* (2015.11)

(58) Field of Classification Search
CPC combination set(s) only.
See application file for complete search history.

(56) References Cited

U.S. PATENT DOCUMENTS

| | | | |
|---|---|---|---|
| 7,125,453 B2 | 10/2006 | D'Evelyn et al. | |
| 7,625,446 B2 | 12/2009 | D'Evelyn et al. | |
| 2009/0301388 A1* | 12/2009 | D'Evelyn | C30B 7/10 117/71 |
| 2010/0158785 A1* | 6/2010 | Fujito | C30B 7/10 423/409 |

* cited by examiner

*Primary Examiner* — Erin F Bergner
(74) *Attorney, Agent, or Firm* — Patterson & Sheridan, LLP (57) ABSTRACT

A pressure release mechanism for use with a capsule for processing materials or growing crystals in supercritical fluids is disclosed. The capsule with the pressure release mechanism is scalable up to very large volumes and is cost effective according to a preferred embodiment. In conjunction with suitable high pressure apparatus, the capsule with pressure release mechanism is capable of processing materials at pressures and temperatures of 20-2000 MPa and 25-1500° C., respectively. Of course, there can be other variations, modifications, and alternatives.

21 Claims, 6 Drawing Sheets

PRESSURE RELEASE MECHANISM FOR CAPSULE AND METHOD OF USE WITH SUPERCRITICAL FLUIDS

REFERENCE TO RELATED APPLICATIONS

This application claims priority to Provisional Application No. 62/220,096, filed Sep. 17, 2015, hereby incorporated by reference.

FIELD OF INVENTION

The disclosure relates generally to a pressure release mechanism for a capsule to be used in high pressure, high temperature applications. The disclosure relates generally to a pressure release mechanism for a capsule to be used with a high pressure apparatus. More particularly, the disclosure relates to a pressure release mechanism for a capsule used in conjunction with a high-pressure apparatus for processing materials in a supercritical fluid.

BACKGROUND

Supercritical fluids may be used to process a wide variety of materials. Examples of supercritical fluids applications include extractions in supercritical carbon dioxide, the growth of quartz crystals in supercritical water, and the synthesis of a variety of nitrides in supercritical ammonia.

Processes that employ supercritical fluids are commonly performed at high pressure and high temperature within a pressure vessel. Most conventional pressure vessels not only provide a source of mechanical support for the pressure applied to reactant materials and supercritical fluids, but also serve as a container for the supercritical fluid and material being processed. The processing limitations for such pressure vessels are typically limited to a maximum temperature in the range between about 400° C. and 600° C. and a maximum pressure in the range between about 100 megapascals (also referred as "MPa") and 500 MPa. Conventional pressure vessels, or autoclaves, are commonly equipped with a pressure release mechanism, such as a pressure relief valve or a rupture disk, that automatically releases or vents pressure from inside the pressure vessel if the pressure exceeds a predetermined value. Such pressure release mechanisms increase the safety margin for operation of pressure vessels at high pressures and high temperatures.

Processing material with supercritical fluids often requires a container or capsule that is substantially both chemically inert and impermeable to the solvent and any gases that might be generated by the process. The capsule should also be substantially impermeable to any gases or materials on the outside of the capsule. These capsules are commonly made in the form of cylinders, possessing a wall and two ends disposed opposite each other along the axis of the cylinder. In one approach, the material to be processed, along with a solvent (liquid) that forms a supercritical fluid at elevated temperatures, is introduced into a capsule at low temperature. After the capsule has been sealed and returned to near room temperature, the capsule will possess an elevated internal pressure as dictated by the vapor pressure and temperature of the solvent (liquid) within the capsule. In the case of ammonia at room temperature, the pressure within the capsule is approximately 150 pounds per square inch. This internal pressure can cause deformation, strain, cracks, leaks, and failure of the capsule, particularly for capsules larger than several inches in dimension, and/or when the capsule is fabricated from a soft metal such as silver or gold. Reinforcing members for one or more outer surfaces of the capsule may be provided in order to increase its ability to safely handle moderate internal pressures.

Capsules for use with supercritical fluids in high pressure apparatus are often hermetically sealed, by welding or the like. Consequently, it may not be a possible to incorporate a pressure release value or rupture disk into the capsule or high pressure apparatus, potentially raising questions about safety.

Therefore, there is a need for improved techniques for processing materials in a high pressure apparatus are highly desirable. The present invention fulfills this need, among others.

SUMMARY OF INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

Applicant recognizes that traditional pressure relief mechanisms do not lend themselves to hermetically sealed process capsules contained within support structures. Accordingly, Applicant discloses a pressure relief mechanism which allows the sealed process capsule to manage over-pressures in a controlled way by limiting its rupture to a small, predetermined area. In one embodiment, this rupture area is limited by defining a small opening in the support structure through which the sealed process captures deforms until it ruptures in a controlled manner. In one embodiment, the small opening in the support structure is covered with a burst disk which breaks once the expansion of the sealed capsule reaches a certain point and exceeds the fracture strength of the burst disk.

In one specific embodiment, the disclosure describes a capsule device for use with supercritical fluids comprises a sealed process capsule and a capsule support member in mechanical contact with the sealed process capsule. The sealed process capsule is configured to contain a fluid and the capsule support member comprises an opening that is configured to allow the sealed process capsule to be deformed into and ruptured. In a further embodiment, the capsule device comprises a burst disk positioned within the opening and supported within an edge region and unsupported in a central region. The burst disk is configured to burst, allowing the process capsule to extrude into the opening and rupture, releasing at least a portion of the fluid.

In another specific embodiment, the disclosure provides a method for processing a material in a supercritical fluid. In one embodiment, the method includes loading at least one material into an interior volume of a process capsule and sealing the process capsule. The method includes placing the process capsule and a pressure release mechanism comprising a capsule support member in mechanical contact with the process capsule. The capsule support member comprises an opening configured to allow the process capsule to be extruded into and ruptured, releasing at least a portion of the fluid at a predetermined temperature between about 25 degrees Celsius and about 1200 degrees Celsius and a predetermined pressure between about 20 MPa and about 1000 MPa. The method further comprises processing the at least one material at a temperature between about 25 degrees Celsius and about 1200 degrees Celsius and a pressure for a period between about 10 minutes and about 300 days. In some embodiments, the pressure release mechanism further comprises a burst disk positioned within the opening and supported within an edge region and unsupported in a central region. The burst disk is configured to burst, allowing the process capsule to extrude into the opening and rupture, releasing at least a portion of the fluid.

In another specific embodiment, the disclosure provides a pressure release mechanism for processing materials in supercritical fluids at high pressure and high temperature. The pressure release mechanism comprises a first capsule support member configured to be in mechanical contact with a first side of a sealed process capsule, wherein the first capsule support member comprises an opening configured to allow the sealed process capsule to be extruded into and ruptured. The pressure release mechanism further comprises a second capsule support member configured to be in mechanical contact with a second side of the sealed process capsule.

DETAILED DESCRIPTION

In the following description reference is made to a capsule that is suitable for use in high pressure and high temperature applications, and the capsule may be used for processing supercritical fluids or materials within supercritical fluids. The capsule may be disposed within a high-pressure apparatus for processing materials in a supercritical fluid, e.g., processing or growing gallium nitride in a supercritical fluid. Merely by way of example, the disclosure may be applied to growing crystals of GaN, AlN, InN, InGaN, AlGaN, AlInGaN, and others for manufacture of bulk or patterned substrates. Such bulk or patterned substrates can be used for a variety of applications including optoelectronic devices, lasers, light emitting diodes, solar cells, photodetectors, and integrated circuits, transistor devices, other device structures, photoelectrochemical water splitting and hydrogen generation, and others. In the following description, terms such as "top", "bottom", "up", "upward", "down", "downward", "outward", "inward", among others are used and are words convenience and are not to be construed as limiting terms.

The present disclosure provides pressure release designs suitable for use with hermetically-sealed capsules in high pressure and high temperature applications. The designs are capable of processing materials at pressures and temperatures of up to approximately 2000 MPa and 1500° C., respectively. One aspect of the present disclosure provides a capsule suitable for use in high pressure and high temperature applications where the capsule wall is radially reinforced by a capsule sleeve. The radially reinforced capsule wall enables the capsule to be pressurized without substantial yielding, bowing, or failure of the capsule, and without requiring exorbitantly thick and expensive capsule materials. In the following description reference is made to this capsule with a capsule sleeve as a "capsule", "capsule with a sleeve", "capsule with a reinforced end", "capsule with a capsule support sleeve", "capsule with a capsule sleeve", "capsule with a support capsule sleeve", among others, and it should be understood that these are terms of convenience and may be used interchangeably and should not be construed as limiting terms. In another aspect of the present disclosure, a dual capsule design is described in which a process capsule is disposed within a support capsule that provides structural support for the process capsule. In the following description reference is made to this process capsule disposed within a support capsule as a "capsule" or "dual capsule" and it should be understood that these are terms of convenience and should not be construed as limiting terms.

Figure 1:
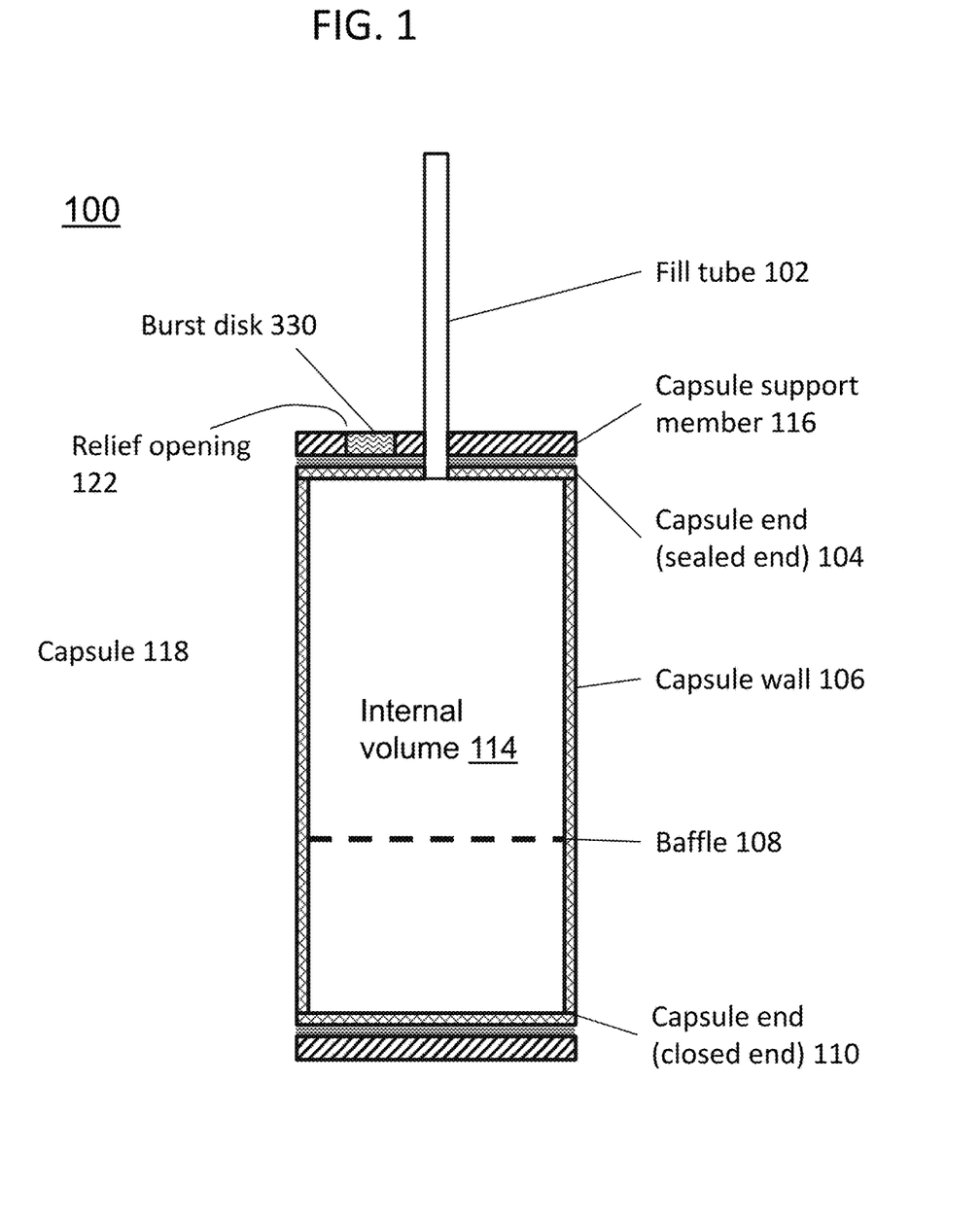
FIG. 1 is a diagram showing a capsule which includes end reinforcement disks and a burst disk assembly, according to some embodiments.

FIG. 1 is a schematic 100 showing a capsule 118 that includes a reinforced end. In various embodiments, capsule 118 may be referred to as a process capsule. The capsule comprises at least one wall, a closed end, shown on the bottom in FIG. 1, and a sealed end, shown on top. The closed end may be attached to the capsule wall prior to use by means of a butt weld. The process capsule possesses a closed end 110, at least one wall 106 adjoining the closed end 110 and extending therefrom, and a sealed end 104 adjoining the at least one wall and opposite of the closed end. "Closed end", "wall", and "sealed end" are terms of convenience and should not be considered to be limiting terms. The closed end 110, at least one wall, and the sealed end 104 define an internal volume 114 within the process capsule capable of containing at least one material and at least one solvent that becomes a supercritical fluid at a high temperature and high pressure condition (also referred to as "HPHT"). HPHT conditions encompass temperatures greater than about room temperature (about 20° C.) and pressures greater than about 1 atmosphere. In one embodiment, the capsule possesses a cylindrical member or shape. In a specific embodiment, the capsule has at least one fill tube 102 disposed on a portion of the capsule sealed end 104. In a specific embodiment, the fill tube 102 has an opening operably coupled to the interior volume 114 of the capsule. Capsule 118 may also be provided with at least one baffle 108 within internal volume 114, the one or more baffles 108 serving to create separate regions within the internal volume 114. The separate regions are in fluid communication with each other since the one or more baffles 108 will typically have a cross-sectional area smaller than the area defined by the inner diameter of the capsule, thereby producing a fractional open area of the baffle. In a specific embodiment, baffle 108 has a fractional open area of between about 0.5% and about 60%, but can also have other percentages. The process capsule wall, capsule end, and baffle materials may comprise copper, copper-based alloy, gold, silver, silver-based alloy, palladium, platinum, platinum-based alloy, iridium, ruthenium, rhodium, osmium, titanium, vanadium, chromium, chromium-based alloy, iron, iron-based alloy, nickel, nickel-based alloy, zirconium, niobium, molybdenum, tantalum, tungsten, rhenium, silica, alumina, combinations of any of the foregoing, and the like.

In one embodiment, the process capsule is substantially chemically inert and impermeable with respect to the at least one material, solvent, and supercritical fluid formed by the solvent disposed within the capsule. In certain embodiments, the capsule is impermeable to at least one of hydrogen, oxygen, and nitrogen. The closed end, at least one wall, and sealable end each have a thickness between about 0.1 mm and about 100 mm according to a specific embodiment. Other thicknesses can also be used depending upon the specific embodiment.

In one embodiment, the sealed end of the process capsule is in mechanical contact with a capsule support member 116. Capsule support member 116 may be bonded to the sealed end of the process capsule and fabricated from a material with a higher modulus and yield strength than that of the material from which the capsule is fabricated. Depending upon the embodiment, the term "bonded" is not intended to be limiting and should be interpreted by ordinary meaning used by one of ordinary skill in the art. In certain embodiments, bonding is achieved by means of a diffusion barrier and a braze layer. The inner portion of the ends may comprise the same material as the capsule wall. The outer portion of the ends comprises a material, the capsule support member 116, with a higher modulus and yield strength that that of the inner portion. The capsule support member 116 may comprise steel, stainless steel, carbon steel, nickel, nickel-based alloy, Inconel, Hastelloy®, Renẽ® 41, Waspalloy®, Mar-M 247®, Monel®, Stellite®, copper, copper-based alloy, zirconium, niobium, molybdenum, tantalum, tungsten, rhenium, platinum, platinum-based alloy, palladium, iridium, ruthenium, rhodium, osmium, titanium, vanadium, chromium, chromium-based alloy, iron, iron-based alloy, gold, silver, or aluminum, combinations of any of the foregoing, and the like. The thickness of the capsule support member 116 may be between 0.050 inches and 2 inches. The diameter of the capsule support member 116 may be equal, to within about 0.050 inches, of the diameter of the remainder of the respective process capsule end. Of course, there can be other variations, modifications, and alternatives. Additional features of the capsule are described in U.S. Patent Publication Number 2009/0301388A1, which is hereby incorporated by reference in its entirety. In various embodiments, the closed end of the process capsule may also be reinforced. In such embodiments, the closed end of the process capsule is mechanical contact with capsule support member 120.

Capsule support member 116 comprises a relief opening 122 configured such that the process capsule may be deformed into the relief opening and ruptured when a predetermined internal pressure limit of the process capsule is exceeded. At least one of the size, shape and location of the relief opening may be selected to allow the process capsule to rupture when the pressure within the process capsule exceeds the predetermined pressure limit. By varying at least one of the size, shape and location of the relief opening, the internal pressure at which the process capsule ruptures may be controlled. In various embodiments, Capsule 100 also comprises a burst disk 330, described in detail below.

Figure 2:
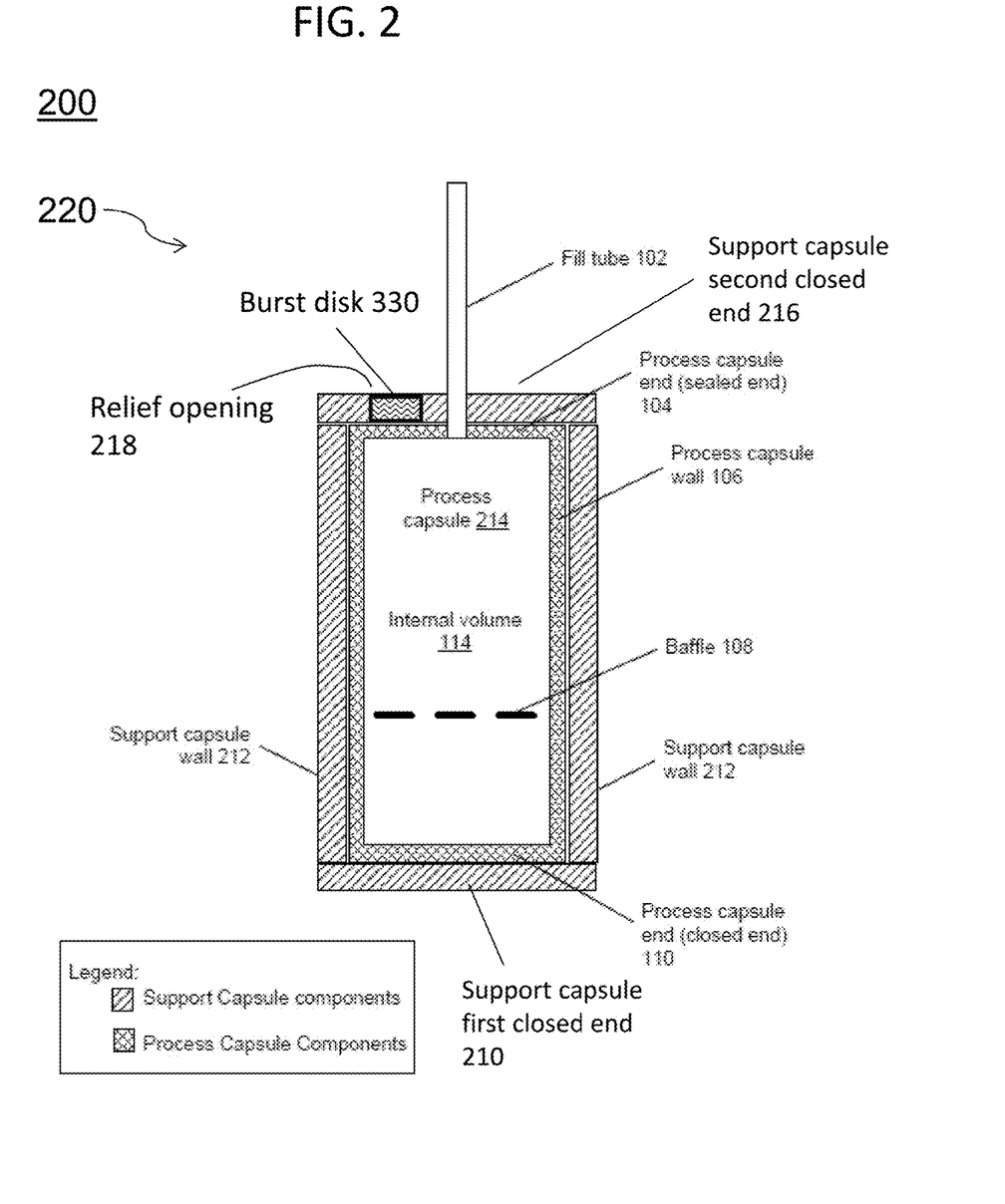
FIG. 2 is a diagram showing a dual capsule design wherein a process capsule is disposed within a support capsule and includes a burst disk assembly, according to some embodiments.

FIG. 2 is a diagram 200 showing a dual capsule 220 design (which may be referred to simply as a "capsule") wherein a process capsule 214 is disposed within a support capsule having a support capsule wall 212. The support capsule provides structural support for the process capsule and comprises at least one capsule support member that is mechanical contact with the process capsule. Furthermore, process capsule 214 may also be provided with at least one baffle 108 within internal volume 114, the one or more baffles 108 serving to create separate regions within the internal volume 114. In one embodiment, the support capsule comprises a support capsule first closed end 210, at least one support capsule wall 212 adjoining the support capsule first closed end 210 and extending therefrom, and a support capsule second closed end 216 adjoining the at least one support capsule wall 212 and opposite of the support capsule first closed end 210. "Support capsule first closed end", "support capsule wall", and "support capsule second closed end" are terms of convenience and should not be considered limiting terms. In various embodiments, "Support capsule first closed end", "support capsule wall", and "support capsule second closed end" may be referred to as capsule support members. The support capsule first closed end 210, at least one support capsule wall 212, and the support capsule second closed end 216 define an internal volume capable of receiving and containing a process capsule. The process capsule possesses a process capsule closed end 110, at least one process capsule wall 106 adjoining the process capsule closed end 110 and extending therefrom, and a process capsule sealed end 104 adjoining the at least one process capsule wall and opposite of the process capsule closed end 110. The process capsule closed end 110, at least one process capsule wall 106, and the process capsule sealed end 104 define an internal volume 114 within the process capsule capable of containing at least one material and at least one solvent that becomes a supercritical fluid at a high temperature and high pressure condition (also referred to as "HPHT"). In certain embodiments, the process capsule is hermetically sealed but the support capsule is not. HPHT conditions encompass temperatures greater than about 100 degrees Celsius and pressures greater than about 1 atmosphere. In some applications the fluid may remain subcritical at HPHT, that is, the pressure or temperature may be less than the critical point. However, in all cases of interest here, the fluid is superheated, that is, the temperature is higher than the boiling point of the fluid at atmospheric pressure. The term "supercritical" will be used throughout to mean "superheated," regardless of whether the pressure and temperature are greater than the critical point, which may not be known for a particular fluid composition with to dissolved solutes. In one embodiment, the capsule possesses a cylindrical member or shape. Process capsule 214 may also be provided with at least one baffle 108 within internal volume 114, the one or more baffles 108 serving to create separate regions within the internal volume 114. The separate regions are in fluid communication with each other since the one or more baffles will typically have a cross-sectional area smaller than the area defined by the inner diameter of the capsule, thereby producing a fractional open area of the baffle. In a specific embodiment, baffle 108 has a fractional open area of between about 0.5% and about 75%, but can also have other percentages. The process capsule wall, process capsule end, and baffle materials may comprise copper, copper-based alloy, gold, silver, silver-based alloy, palladium, platinum, platinum-based alloy, iridium, ruthenium, rhodium, osmium, titanium, vanadium, chromium, chromium-based alloy, iron, iron-based alloy, nickel, nickel-based alloy, zirconium, niobium, molybdenum, tantalum, tungsten, rhenium, silica, alumina, combinations of any of the foregoing, and the like.

In various embodiments, the structural support capsule prevents substantial deformation, strain, cracks, leaks, and/or failure of the process capsule due to the longitudinal and radial stresses that result from heating the process capsule after filling the process capsule with a solvent. The solvent (or fluid) within the process capsule will have a particular pressure as dictated by the specific fluid type and its density and temperature, and this pressure can result in significant stresses on the process capsule, especially for capsules with one or more large dimensions. The present disclosure enables the inner process capsule to be pressurized without significant yielding or bowing of the capsule that potentially results in process capsule failure. Some bowing of the process capsule may occur, but not enough to result in process capsule failure. Instead, according to the disclosure, the process capsule is supported by the support capsule.

The support capsule prevents cracks, leaks, and catastrophic failure of the process capsule for the instances when the process capsule does experience some yielding or bowing. The outer support capsule may comprise steel, stainless steel, carbon steel, nickel, nickel-based alloy, Inconel®, HasteHoy®, Rene® 41, Waspalloy R, Mar-M 247®, Monel®, Stellite®, copper, copper-based alloy, zirconium, niobium, molybdenum, tantalum, tungsten, rhenium, platinum, platinum-based alloy, palladium, iridium, ruthenium, rhodium, osmium, titanium, vanadium, chromium, chromium-based alloy, iron, iron-based alloy, gold, silver, or aluminum, combinations of any of the foregoing, and the like. The process capsule may comprise copper, copper-based alloy, gold, silver, palladium, platinum, platinum-based alloy, iridium, ruthenium, rhodium, osmium, titanium, vanadium, chromium, chromium-based alloy, iron, iron-based alloy, nickel, nickel-based alloy, zirconium, niobium, molybdenum, tantalum, tungsten, rhenium, combinations of any of the foregoing, and the like. In one embodiment of the present disclosure, the process capsule i may be constructed of a deformable material that enables the process capsule to expand when pressurized by the at least one solvent within the capsule. In one embodiment, the support capsule is constructed to have a yield strength which, when taken in combination with the process capsule, exceeds that of the stress exerted on the capsule by the vapor pressure and temperature of a fluid (or solvent) disposed within the process capsule. In one embodiment, the support capsule has a yield strength that exceeds that of the stress exerted on the capsule by the vapor pressure and temperature of a fluid (or solvent) disposed within the process capsule. In one embodiment, the support capsule is formed from one or more materials with a higher Young's modulus than the Young's modulus of a material of the process capsule. In one embodiment, the support capsule is formed from one or more materials with a higher yield strength than the yield strength of a material of the process capsule. In a specific embodiment, the support capsule has a higher yield strength than the yield strength of the process capsule. In a specific embodiment, the support capsule has a higher Young's modulus than the Young's modulus of the process capsule. In one embodiment, the support capsule is chosen to have a yield strength that exceeds that of the longitudinal stress exerted on the support capsule by the process capsule. Additional features of the capsule are described in U.S. patent application Ser. No. 13/657,551, which is hereby incorporated by reference in its entirety.

Support capsule 220 comprises a relief opening 218 configured such that the process capsule may be deformed into the relief opening and ruptured when an internal pressure limit of the process capsule is exceeded. At least one of the size, shape and location of the relief opening may be selected to allow the process capsule to rupture when the process capsule exceeds the pressure limit. By varying at least one of the size, shape and location of the relief opening, the internal pressure at which the process capsule ruptures may be controlled. In various embodiments, Capsule 220 also comprises a burst disk 330, described in detail below.

Figure 3:
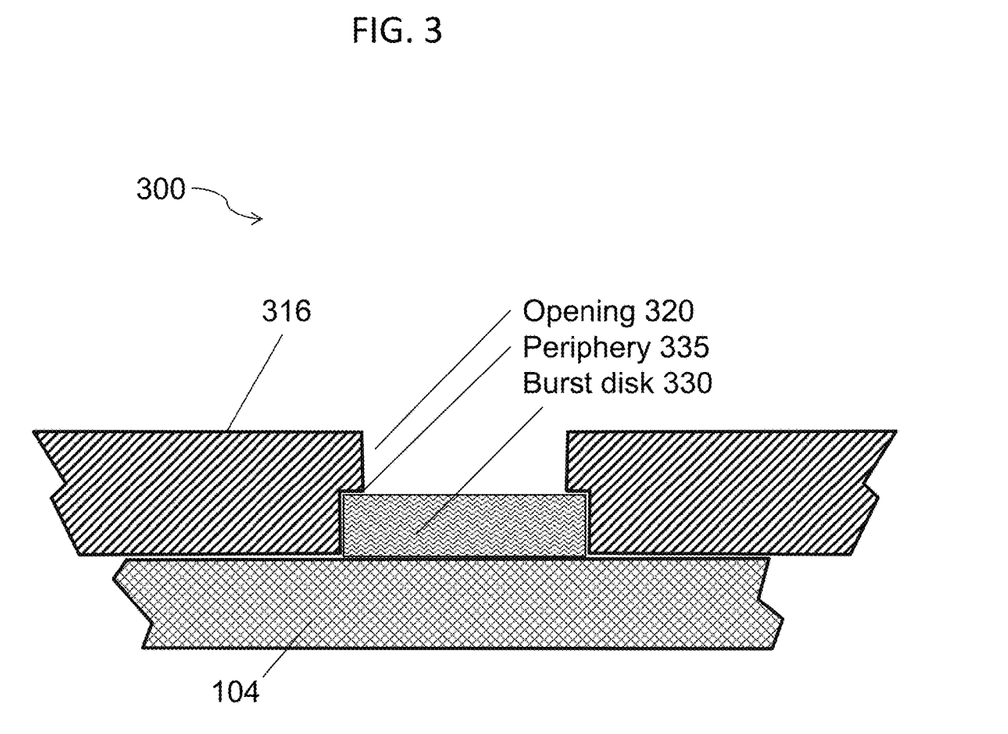
FIG. 3 is a diagram of a burst disk assembly, according to some embodiments.

FIG. 3 shows a burst disk assembly 300, for example, for a capsule 118 or a capsule 220. Referring to FIG. 3, relief opening 320, for example, a hole, is provided in capsule support member 316. Relief opening 320 may have a diameter between about 2 millimeters and about 200 millimeters, or between about 5 millimeters and about 50 millimeters. In certain embodiments, for example, capsule 220 as shown in FIG. 2, capsule support member 316 corresponds to support capsule sealed end 216. Burst disk 330 is placed within relief opening 320 and proximate to process capsule sealed end 104 in such that capsule support member 316 supports said burst disk along an edge portion of said burst disk, leaving said interior portion of said burst disk unsupported. Burst disk 330 may be configured to burst when said internal pressure limit of the sealed process capsule is exceeded, causing fracture of the burst disk due to generation of a tensile stress exceeding its fracture stress and allowing said sealed process capsule to deform into the relief opening and rupture. Burst disk 330 may be fabricated from a ceramic, metal, cermet, glass, or single crystal material. In certain embodiments, mechanical support at periphery 335 is provided by a lip within relief opening 320 formed, for example, by counter-boring opening 320 from the side of capsule support member 316 from the side proximate to capsule sealed end 104. In certain embodiments, mechanical support at periphery 335 is provided by a ceramic or metal cylinder held in place by a snap ring. In certain embodiments periphery 335 is simply supported, that is, the edge may freely rotate as the central portion of burst disk 330 flexes upwards due to pressure from capsule sealed end. In certain embodiments periphery 335 is fixed or partially fixed, that is, periphery 335 is rigidly attached to its support, for example, by means of a braze joint, so that the edge is inhibited from rotation as the central portion of burst disk 330 flexes upward due to pressure from capsule sealed end 104.

Figure 4:
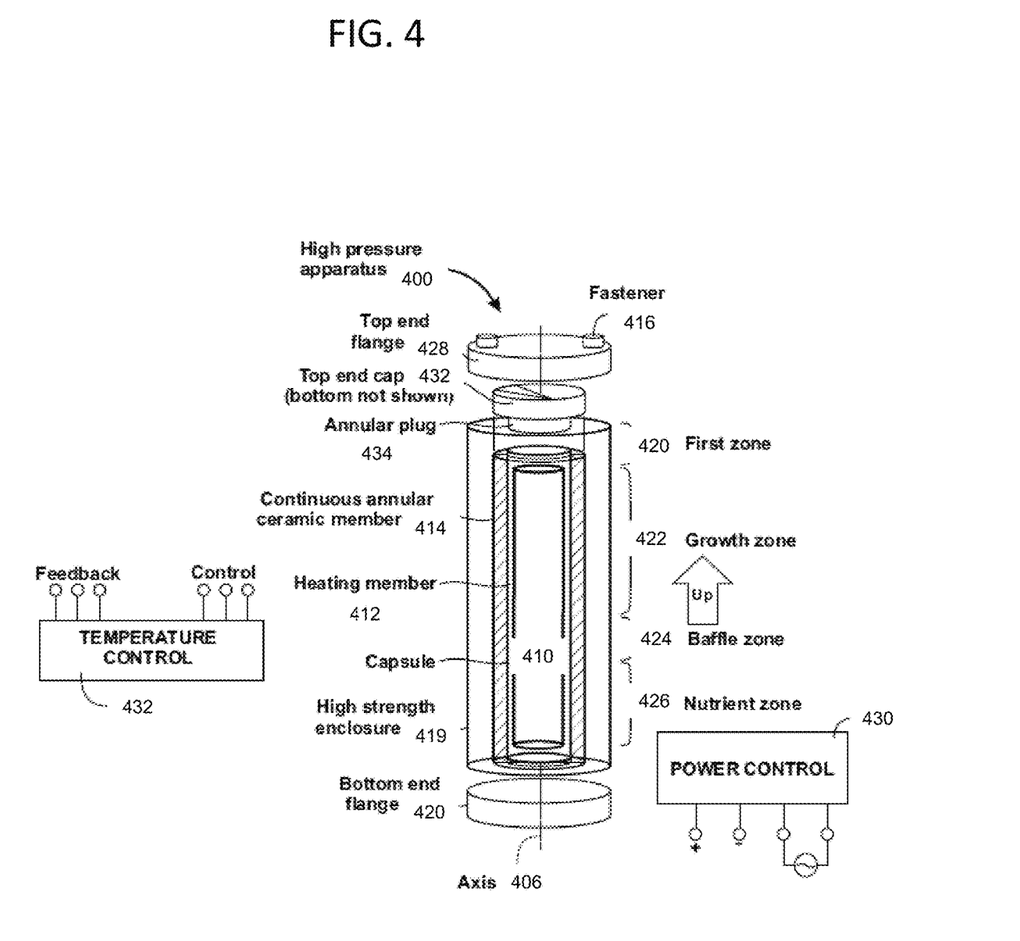
FIG. 4 is a simplified diagram of a high pressure apparatus, according to some embodiments.

During operation, a capsule such as capsule 118 or 200 is placed with a suitable high pressure apparatus. An example of such an apparatus is shown schematically in FIG. 4. Referring to FIG. 4, high pressure apparatus 400 and related methods for processing supercritical fluids are disclosed. In a specific embodiment, the present apparatus 400 includes a capsule 410, a heating member or heater 412, at least one ceramic ring 414 but can be multiple rings, optionally, with one or more scribe marks and/or cracks present. The apparatus also has a high-strength enclosure 418, end flanges 426, 428 with associated insulation, and a power control system 430. The apparatus is scalable up to very large volumes and is cost effective. In a specific embodiment, the apparatus is capable of accessing pressures and temperatures of 20-2000 MPa and 400-1200° C., respectively. In a specific embodiment, the apparatus also includes a temperature controller 432. Of course, there can be other variations, modifications, and alternatives.

In a specific embodiment, apparatus 400 comprises at least one heat zone and optionally more, such as multiple, including two or more. The heat zones include an uppermost first zone 420, a growth zone 422, a baffle zone 424, and a charge or nutrient zone 426 according to a specific embodiment. When a capsule is inserted into the volume defined by a heater inner surface, an internal baffle (not shown in FIG. 4) aligns with the baffle gap zone according to a specific embodiment. The baffle defines two chambers inside the capsule, one for nutrient and one for growth according to a specific embodiment. The two chambers communicate through the perforated baffle, which can have various shapes and configurations. In the illustrated embodiment, appropriate for crystal growth when the solubility of the material to be recrystallized is an increasing function of temperature, the growth zone is located above the nutrient zone. In other embodiments, appropriate for crystal growth when the solubility of the material to be recrystallized is a decreasing function of temperature, i.e., retrograde solubility, the growth zone is located below the nutrient zone. In still other embodiments, apparatus 400 is approximately horizontal rather than vertical and may be fitted with a rocking mechanism (not shown). Additional details of high pressure apparatus 400 are disclosed in U.S. Pat. Nos. 8,097,081, 8,303,710, and 8,435,347, each of which is hereby incorporated by reference in their entirety.

It is important to note that the cell components surrounding capsule 410, such as annular plug 434, top end cap 432 and top end flange 428, are not leak tight. Consequently, any pressurized fluid that escapes or is released from capsule 410 will be released to the environment of high pressure apparatus 400. In certain embodiments, high pressure apparatus 400 is housed within a ventilated, primary containment structure, such as that described in U.S. Patent Application Publication No. 2011/0100291, which is hereby incorporated by reference in its entirety. In these embodiments any pressurized fluid, such as ammonia, that is released from high pressure apparatus 400 is contained and sent to a controlled fluid stream.

During operation, when an applied pressure P is applied to the burst disk by the outward-facing surface of capsule sealed and 104, the center of burst disk 330 will displace outward by distance d, given approximately by $$d = \frac{3a^4}{16t^3} \frac{1-v^2}{E} P K_d \quad (1)$$

where a is its radius, t is its thickness, E is its Young's modulus, v is its Poisson's ratio, and the coefficient $K_d$ is equal to $(5+v)/(1+v)$ for simply supported boundary conditions or 1 for fixed boundary conditions, as is known in the art. The stress σ on the tensile side at the center of burst disk 330 is related to the applied pressure P by, approximately, $$\sigma = \frac{3a^2}{8t^2} P K_\sigma \quad (2)$$

where the coefficient $K_\sigma$ is equal to $3+v$ if the disk is simply supported or $1+v$ if the disk is fixed. When the stress exceeds the bending strength of the burst disk it will rupture, causing extrusion of a portion of capsule sealed end 104 into opening 320 followed by rupture and leaking of the pressurized fluid within interior volume 114. By appropriate choice of the composition of burst disk 330, its diameter, and its thickness, therefore, the capsule can be caused to fail during operation at a predetermined pressure, much like a pressure relief value or rupture disk limits the maximum pressure within a conventional pressure vessel for improved safety.

Figure 5:
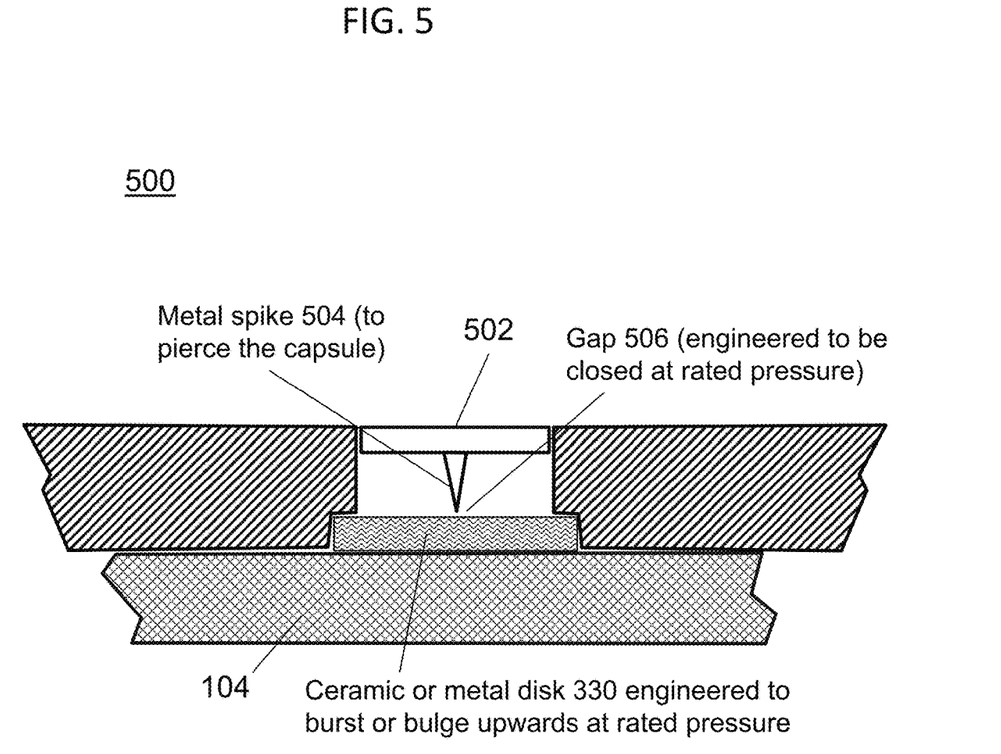
FIG. 5 is a diagram of a piercing mechanism for a burst disk assembly, according to some embodiments.

In certain embodiments, as shown in FIG. 5, piercing mechanism 502, for example, comprising spike 504, is provided within the unsupported volume above the burst disk 330 as a component of a burst disk assembly 500. The spike 504 has the effect of forcing puncture of capsule sealed end 104 or capsule closed end 110 (see FIGS. 1 and 2) after burst pressure disk 330, if present, ruptures. In one embodiment, the gap 506 between the end of the piercing mechanism and the burst disk (or capsule sealed end or closed end, if the burst disk is omitted) is selected such that the process capsule is punctured and ruptured at a predetermined temperature and/or pressure. In some embodiments, the burst disk is not included. In such embodiments, at least one of the size, shape and location of the opening may be selected to allow the process capsule 105 to deform into the relief opening and rupture at a predetermined pressure limit. Further, a piercing mechanism 502 may be included where the gap 506 between an end of the piercing mechanism and process capsule may be selected such that the process capsule is punctured and ruptured at a predetermined pressure limit.

Referring again to FIG. 3, burst disk 330 may comprise a ceramic or single crystal material, such as alumina, silicon nitride, silicon carbide, zirconia, or sapphire. Other materials can also be chosen. The front and back surfaces of burst disk 330 may be lapped or polished. Examples of design calculations, using Eqs. (1) and (2) and published values for E, v, and burst strength of commercially-available ceramic materials, are shown in Table 1 for a design burst pressure of 300 MPa. As is apparent from Table 1 and Eqs. (1) and (2), the burst disk assembly can be designed for a wide range of operating pressures. It is important to note that the goal of the burst disk assembly is to allow the capsule to be ruptured at a predetermined pressure and temperature. Therefore, the assembly will be designed taking into account the desired burst pressure, material and thickness of capsule wall, safe operation pressure for the capsule, and the operating temperature of the capsule.

TABLE 1

Sample burst disk design calculations for a burst pressure of 300 MPa and a disk diameter of 0.375 inch (9.525 mm).

| Material | E (GPa) | v | Flexural strength (MPa) | t (mm) | σ (MPa) | dmax (mm) | t (mm) | σ (MPa) | dmax (mm) |
|---|---|---|---|---|---|---|---|---|---|
| sapphire | 470 | 0.2 | 690 | 6.88 | 690 | 0.013 | 4.21 | 690 | 0.013 |
| Al2O3 | 360 | 0.23 | 360 | 9.57 | 360 | 0.006 | 5.91 | 360 | 0.006 |
| Si3N4 | 300 | 0.28 | 1020 | 5.73 | 1020 | 0.031 | 3.58 | 1020 | 0.031 |
| SiC | 440 | 0.16 | 540 | 7.73 | 540 | 0.010 | 4.68 | 540 | 0.010 |
| ZrO2 | 200 | 0.31 | 1470 | 4.79 | 1470 | 0.077 | 3.02 | 1470 | 0.076 |

The pressure acting on the surface of the burst disk (cf. Eqs. (1) and (2)) will be lower than the pressure inside the capsule. This is because the material of the capsule in the region directly below the burst disk transmits the pressure to the burst disk through its own deflection upwards and, this deflection depends on: (i) mechanical properties of the capsule material at the operating temperature; (ii) the pressure inside the capsule; and (iii) the ratio of the lateral dimensions of the burst area to the thickness of the capsule material (aspect ratio) at the burst location. Taking these effects into account may or may not yield to closed-form solution depending on whether the capsule material exhibits non-linear constitutive behavior (e.g., plasticity) and/or whether the aspect ratio is large enough that 3D deformation behavior can be ignored. In practice taking these effects into account may cause the designer to resort to the finite element method or other numerical techniques to engineer the burst-disk assembly. Furthermore, any uncertainty in material properties may be resolved through pressure-calibrated experiments involving several designs.

Figure 6:
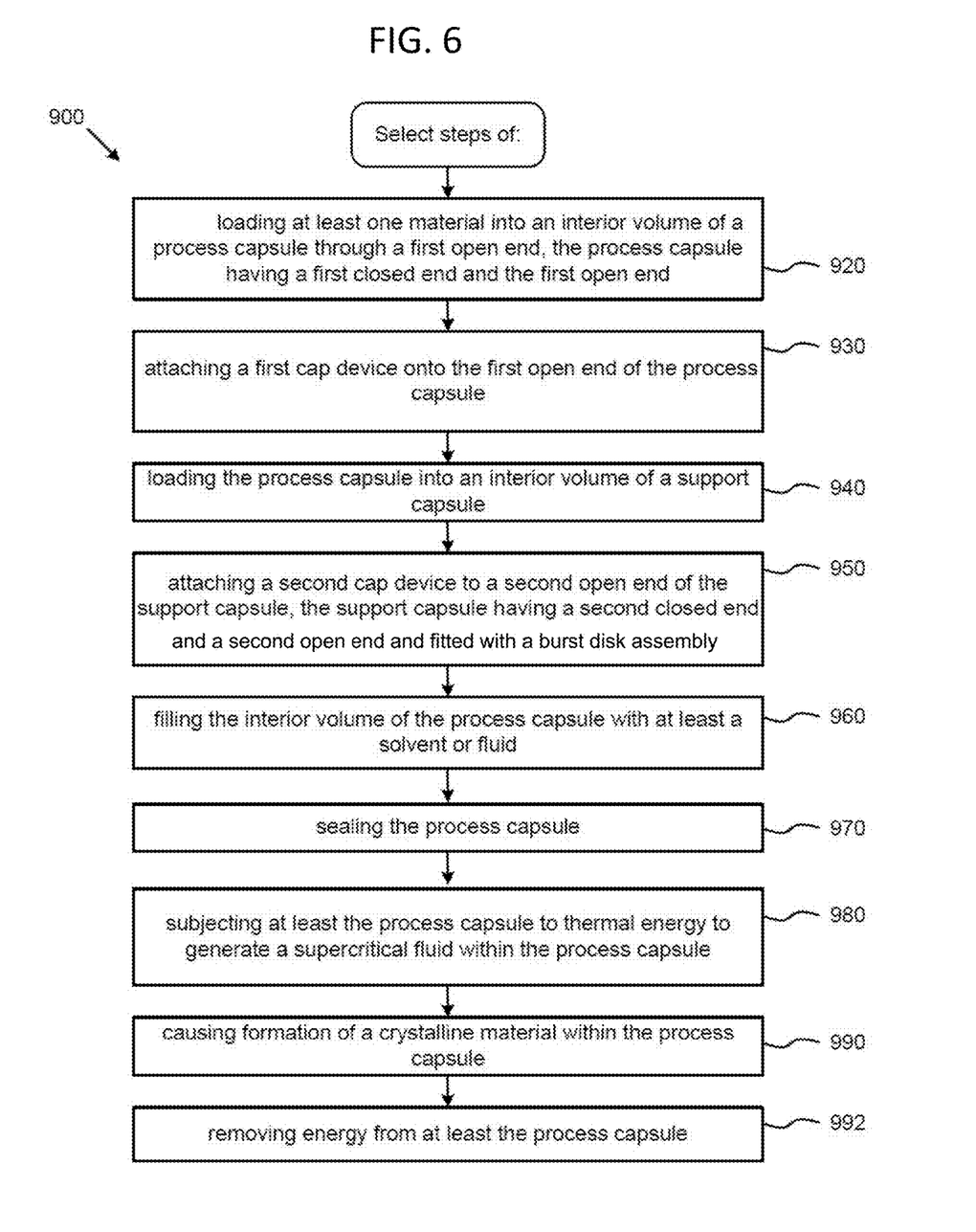
FIG. 6 shows method steps that can be practiced while using a capsule for high pressure, high temperature processing according to various embodiments.

FIG. 6 shows method steps that may be practiced while using a capsule for high pressure, high temperature processing. As an option, the present system 900 may be implemented in the context of the architecture and functionality of the embodiments described herein. Of course, however, the system 900 or any operation therein may be carried out in any desired environment. As shown, an operation may be implemented in whole or in part using program instructions accessible by a module. The modules can be connected to a communication path, and any operation can communicate with other operations over said communication path. The modules of the system can, individually or in combination, perform method operations within system 900. Any operations performed within system 900 may be performed in any order unless as may be specified in the claims. The embodiment of FIG. 6 implements modules to perform: loading at least one material into an interior volume of a process capsule through a first open end, the process capsule having a first closed end and the first open end (see module 920); attaching a first cap device onto the first open end of the process capsule (see module 930); loading the process capsule into an interior volume of a support capsule (see module 940); attaching a second cap device to a second open end of the support capsule, the support capsule having a second closed end and a second open end and a burst disk assembly (see module 950); filling the interior volume of the process capsule with at least a solvent or fluid (see module 960); sealing the process capsule (see module 970); subjecting at least the process capsule to thermal energy to generate a supercritical fluid within the process capsule (see module 980); causing formation of a crystalline material within the process capsule (see module 990); removing energy from at least the process capsule (see module 992); and removing material from the process capsule (see module 994).

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A capsule device for use with supercritical fluids, said capsule device comprising:
a sealed process capsule configured to contain a fluid;
a capsule support member in mechanical contact with said sealed process capsule to provide mechanical support of said sealed process capsule, said capsule support member comprising a relief opening configured such that said sealed process capsule deforms into said relief opening and ruptures when a predetermined internal pressure limit is exceeded; and
a burst disk disposed in contact with said capsule support member to block said relief opening, wherein said burst disk is configured to burst when said predetermined internal pressure limit is exceeded, allowing said sealed process capsule to deform into said relief opening and rupture, thereby releasing at least a portion of said fluid.

2. The capsule device of claim 1, wherein said predetermined internal pressure limit is between about 20 MPa and about 2000 MPa.

3. The capsule device of claim 2, wherein said predetermined internal pressure limit is between about 50 MPa and about 600 MPa.

4. The capsule device of claim 1, wherein said predetermined internal pressure limit is designed to occur to a temperature between about 25 degrees Celsius and about 1500 degrees Celsius.

5. The capsule device of claim 4, wherein said internal pressure limit is designed to occur to a temperature between about 400 and about 900 degrees Celsius.

6. The capsule device of claim 1, wherein said capsule support member supports said burst disk along an edge portion of said burst disk, leaving an interior portion of said burst disk unsupported.

7. The capsule device of claim 1, wherein said burst disk is fabricated from a ceramic, metal, cermet, glass, or single crystal material.

8. The capsule device of claim 1, wherein said burst disk is fabricated from a material selected from one of alumina, silicon carbide, silicon nitride, zirconia, and sapphire.

9. The capsule device of claim 1, wherein said relief opening has a diameter between about 2 millimeters and about 200 millimeters.

10. The capsule device of claim 9, wherein said relief opening has a diameter between about 5 millimeters and about 50 millimeters.

11. A capsule device for use with supercritical fluids, said capsule device comprising:
a sealed process capsule configured to contain a fluid;
a capsule support member in mechanical contact with said sealed process capsule to provide mechanical support of said sealed process capsule, said capsule support member comprising a relief opening configured such that said sealed process capsule deforms into said relief opening and ruptures when a predetermined internal pressure limit is exceeded; and
a piercing mechanism at least partially disposed in said relief opening to puncture said sealed process capsule when said sealed process capsule deforms into said relief opening.

12. The capsule device of claim 1, wherein said sealed process capsule and said capsule support member are comprised of different materials.

13. A method for processing at least one material in a fluid, said method comprising:
loading said at least one material and said fluid into an interior volume of a process capsule;
sealing said process capsule;
placing said sealed process capsule and a pressure release mechanism into a high pressure apparatus, said pressure release mechanism comprising a capsule support member in mechanical contact with said sealed process capsule to provide mechanical support for said sealed process capsule, said capsule support member comprising a relief opening configured such that said process capsule deforms into said relief opening and ruptures when a predetermined internal pressure limit is exceeded, thereby releasing at least a portion of said fluid from said sealed process capsule and from the high pressure apparatus; and processing said at least one material.

14. The method of claim 13, wherein a burst disk is disposed in contact with said capsule support member to block said relief opening, wherein said burst disk is configured to burst when said predetermined internal pressure limit is exceeded, allowing said sealed process capsule to deform into said relief opening and rupture, thereby releasing at least a portion of said fluid.

15. The method of claim 13, wherein said predetermined internal pressure limit is between about 20 MPa and about 2000 MPa.

16. The method of claim 13, wherein said predetermined internal pressure limit is between about 50 MPa and about 600 MPa.

17. The method of claim 13, wherein said at least one material comprises gallium nitride and said fluid comprises ammonia.

18. A pressure release mechanism for use with supercritical fluids, said pressure release mechanism comprising:

a capsule support member in mechanical contact with a sealed process capsule to provide mechanical support for said sealed process capsule, said capsule support member comprising a relief opening; and a burst disk disposed in mechanical contact with said capsule support member to block said relief opening, wherein said burst disk is configured to burst when a predetermined internal pressure limit is exceeded, allowing said sealed process capsule to deform into said relief opening and rupture, thereby releasing at least a portion of said fluid.

19. The pressure release mechanism of claim 18, wherein said internal pressure limit is designed to occur to a temperature between about 400 and about 900 degrees Celsius.

20. The pressure release mechanism of claim 18, wherein said burst disk is fabricated from a material selected from one of alumina, silicon carbide, silicon nitride, zirconia, and sapphire.

21. The pressure release mechanism of claim 20, wherein said capsule support member supports said burst disk along an edge portion of said burst disk, leaving an interior portion of said burst disk unsupported.

* * * * *